US008787506B2

(12) United States Patent
Sikri

(10) Patent No.: US 8,787,506 B2
(45) Date of Patent: Jul. 22, 2014

(54) DECODERS AND METHODS FOR DECODING CONVOLUTIONAL CODED DATA

(75) Inventor: Divaydeep Sikri, Farnborough (GB)

(73) Assignee: QUALCOMM Incorporated, San Diego, CA (US)

( * ) Notice: Subject to any disclaimer, the term of this patent is extended or adjusted under 35 U.S.C. 154(b) by 42 days.

(21) Appl. No.: 13/464,667

(22) Filed: May 4, 2012

(65) Prior Publication Data

US 2013/0294550 A1    Nov. 7, 2013

(51) Int. Cl.
*H04L 27/06* (2006.01)

(52) U.S. Cl.
USPC .......................................................... 375/341

(58) Field of Classification Search
CPC ... H04L 1/00; H04L 1/0054; H03M 13/3776; H03M 13/09; H03M 13/41; H03M 13/23; H03M 13/3715; H03M 13/373
USPC ................. 375/211, 260, 261, 298, 340, 341; 714/758, 760, 786, 787
See application file for complete search history.

(56) References Cited

U.S. PATENT DOCUMENTS

| 5,327,441 | A * | 7/1994 | Kawazoe et al. ............. 714/795 |
| 7,965,761 | B2 | 6/2011 | Shattil |
| 8,077,813 | B2 | 12/2011 | Furman et al. |
| 2002/0015451 | A1* | 2/2002 | Nafie et al. ................... 375/262 |
| 2005/0091566 | A1 | 4/2005 | Berens et al. |
| 2009/0175389 | A1 | 7/2009 | Huang et al. |
| 2010/0158161 | A1 | 6/2010 | Sambhwani et al. |
| 2010/0185923 | A1 | 7/2010 | Chappaz |
| 2010/0272011 | A1 | 10/2010 | Palanki et al. |
| 2011/0051831 | A1 | 3/2011 | Subrahmanya et al. |
| 2011/0131465 | A1 | 6/2011 | Eroz et al. |
| 2011/0167322 | A1 | 7/2011 | Parthasarathy et al. |

(Continued)

FOREIGN PATENT DOCUMENTS

GB      2358767 A       8/2001
WO      2005069526 A1   7/2005

OTHER PUBLICATIONS

"Digital cellular telecommunications system (Phase 2+); Channel coding (3GPP TS 45.003 version 4.0.0 Release 4); ETSI TS 145 003", IEEE, Lis, Sophia Antipolis Cedex, France, vol . 3-G1, No. V4.0.0, Jan. 1, 2001, XP014010658, ISSN: 0000-0001 p. 114.

(Continued)

*Primary Examiner* — Sam K Ahn
*Assistant Examiner* — Syed Haider
(74) *Attorney, Agent, or Firm* — QUALCOMM IP Department; James Hunt Yancey, Jr.

(57) ABSTRACT

Decoder and communications devices including such decoders can obtain a convolutional coded bit stream including a plurality of coded data bits. According to some implementations, if a signal quality associated with the convolutional coded bit stream is above a predetermined threshold, a decoded value for each information bit may be calculated at least from a modulo 2 sum of a coded data bit added to at least one other coded data bit, at least one previously calculated information bit, or a combination of at least one other coded data bit and at least one previously calculated information bit. Also, according to some implementations, if the signal quality associated with the convolutional coded bit stream is not above the predetermined threshold, the convolutional coded bit stream may be decoded with a conventional convolutional decoding scheme. Other aspects, embodiments, and features are also claimed and described.

22 Claims, 8 Drawing Sheets

(56) References Cited

U.S. PATENT DOCUMENTS

2011/0194571 A1 8/2011 Ozluturk et al.
2011/0283162 A1 11/2011 Murakami
2013/0294551 A1 11/2013 Sikri

OTHER PUBLICATIONS

Digital cellular telecommunications system (Phase 2+); Channel coding (3GPP TS 45.003 version 9.0.0 Release 9), ETSI TS 145 003 V9.0.0 (Feb. 2010), pp. 1-322.

Gnanasekaran, et al., "Modified Soft Output Viterbi Error Correcting Algorithm," IJCSNS International Journal of Computer Science and Network Security, vol. 8, No. 9, Sep. 2008, pp. 161-165.
International Search Report and Written Opinion—PCT/US2013/039221—ISA/EPO—Jul. 5, 2013.
Kang K.M., et al., "Modulo-Type Viterbi Decoder for High-Speed Digital Transmission Systems", IEEE Communications Letters, IEEE Service Center, Piscataway, NJ, US, vol. 4, No. 2, Feb. 1, 2000, pp. 68-70, XP011083852, ISSN: 1089-7798, DOI: 10.1109/4234.824759.

* cited by examiner

DECODERS AND METHODS FOR DECODING CONVOLUTIONAL CODED DATA

TECHNICAL FIELD

Aspects of the present disclosure relate generally to communication systems, and more particularly, to devices and methods adapted to facilitate algebraic decoding of convolutional coded data.

BACKGROUND

Within a typical digital communications system, information is represented as a sequence of binary bits (e.g., ones and zeros). To transmit the information, the binary bits are modulated onto an analogue signal waveform, and transmitted over a communications channel. The communications channel may introduce noise and interference that can corrupt the transmitted signal. At the receiver, the corrupted received signal is mapped back into the digital domain, although bit errors may result due to the introduced noise.

To compensate for bit errors, channel coding is often used in digital communications systems to allow for error detection and correction to occur. Channel coding is often accomplished by selectively introducing redundant bits into the transmitted bit stream. These redundant bits allow detection and correction of bit errors in a received bit stream.

One type of channel code includes convolutional codes. Convolutional codes are one of the most widely used channel codes in practical communications systems. The ratio between the number of input bits and the number of output bits is called the code rate. For instance, a convolutional coder which calculates two output bits for each input bit is typically referred to as a half-rate convolutional coder. Similarly, a convolutional coder which calculates three output bits for each input bit is typically referred to as a one-third-rate convolutional coder.

When a bit stream is convolutional coded, the communicating entities may each employ a decoder that implements a Viterbi algorithm. The Viterbi algorithm is one of the most resource-consuming algorithms for decoding a convolutional coded bit stream, but the Viterbi algorithm does provide the statistical maximum likelihood decoding. Such maximum likelihood decoding is especially valuable when signal quality is low.

BRIEF SUMMARY OF SOME EMBODIMENTS

Although a Viterbi decoder can be beneficial in instances when signal quality is low, employing an algorithm such as the Viterbi algorithm can be more than is needed to accurately decode a bit stream when the signal quality is sufficiently high. Thus, it may be beneficial to enable a communications system to employ decoders capable of employing less resource-consuming algorithms when signal quality of the received bit stream is sufficiently high. Embodiments of the present invention are provisioned to enable and provide decoders and methods to decode data in an efficient manner with better than poor signal quality.

Various aspects of the present disclosure provide devices and methods adapted to facilitate algebraic decoding of convolutional coded data when signal quality of the received bit stream is sufficiently high. One or more aspects provide decoders adapted to decode a convolutional coded bit stream. According to at least one example, such decoders may include a first decoding component. This component may comprise multiple sub-components in some implentations (e.g., a receiving component, a first processing component, a second processing component). The first decoding component can be adapted to obtain at least one coded data bit from a convolutional coded bit stream. The first decoding component may further be adapted to determine a decoded value for an information bit at least by calculating a modulo 2 sum of the coded data bit added to one or more other coded data bits, one or more previously calculated information bits, or a combination of one or more other coded data bit and one ore more previously calculated information bits. Such a decoder may further include a second decoding component adapted to decode the convolutional coded bit stream with Viterbi decoding.

Additional aspects of the present disclosure provide communications devices adapted to facilitate decoding of convolutional coded data. According to one or more examples, such communications devices may include a communications interface and a storage medium coupled to a processing circuit. The processing circuit may include a decoder adapted to receive a convolutional coded bit stream that includes a plurality of coded data bits. The decoder may determine whether a signal quality associated with the convolutional coded bit stream is above a predetermined threshold. When the signal quality is above the predetermined threshold, the decoder may calculate a decoded value for each information bit at least from a modulo 2 sum of a coded data bit added to at least one other coded data bit, at least one previously calculated information bit, or a combination of at least one other coded data bit and at least one previously calculated information bit.

Still additional aspects of the present disclosure provide methods operational on a communications device and/or a communications device including means for performing such methods. One or more examples of such methods may include receiving a convolutional coded bit stream with a plurality of coded data bits, and determining whether a signal quality associated with the convolutional coded bit stream is above a predetermined threshold. If the signal quality associated with the convolutional coded bit stream is above the predetermined threshold, a decoded value for each information bit may be determined at least by calculating a modulo 2 sum of a coded data bit added to at least one other coded data bit, at least one previously calculated information bit, or a combination of at least one other coded data bit and at least one previously calculated information bit.

Yet further aspects of the present disclosure include machine-readable mediums comprising instructions operational on a communications device. According to one or more examples, such instructions may cause a processor to determine whether a signal quality associated with a convolutional coded bit stream is above a predetermined threshold. When the signal quality is above the predetermined threshold, the instructions may further cause the processor to determine a decoded value for each information bit associated with the convolutional coded bit stream at least by calculating a modulo 2 sum of a coded data bit added to at least one other coded data bit, at least one previously calculated information bit, or a combination of at least one other coded data bit and at least one previously calculated information bit.

Other aspects, features, and embodiments of the present invention will become apparent to those of ordinary skill in the art, upon reviewing the following description of specific, exemplary embodiments of the present invention in conjunction with the accompanying figures. While features of the present invention may be discussed relative to certain embodiments and figures below, all embodiments of the present invention can include one or more of the advantageous features discussed herein. In other words, while one or more embodiments may be discussed as having certain advantageous features, one or more of such features may also be used in accordance with the various embodiments of the invention discussed herein. In similar fashion, while exemplary embodiments may be discussed below as device, system, or method embodiments it should be understood that such exemplary embodiments can be implemented in various devices, systems, and methods.

BRIEF DESCRIPTION OF THE DRAWINGS

FIG. 7 is a block diagram illustrating an example where all four bursts are available for decoding in a first decoding component of a decoder.

FIG. 8 is a block diagram illustrating an example where only three of four bursts are available for decoding in a first decoding component of a decoder.

FIG. 9 is a block diagram illustrating an example where only two consecutive burst out of four bursts are available for decoding in a first decoding component of a decoder.

DETAILED DESCRIPTION

The description set forth below in connection with the appended drawings is intended as a description of various configurations and is not intended to represent the only configurations in which the concepts and features described herein may be practiced. The following description includes specific details for the purpose of providing a thorough understanding of various concepts. However, it will be apparent to those skilled in the art that these concepts may be practiced without these specific details. In some instances, well known circuits, structures, techniques and components are shown in block diagram form in order to avoid obscuring the described concepts and features.

Figure 1:
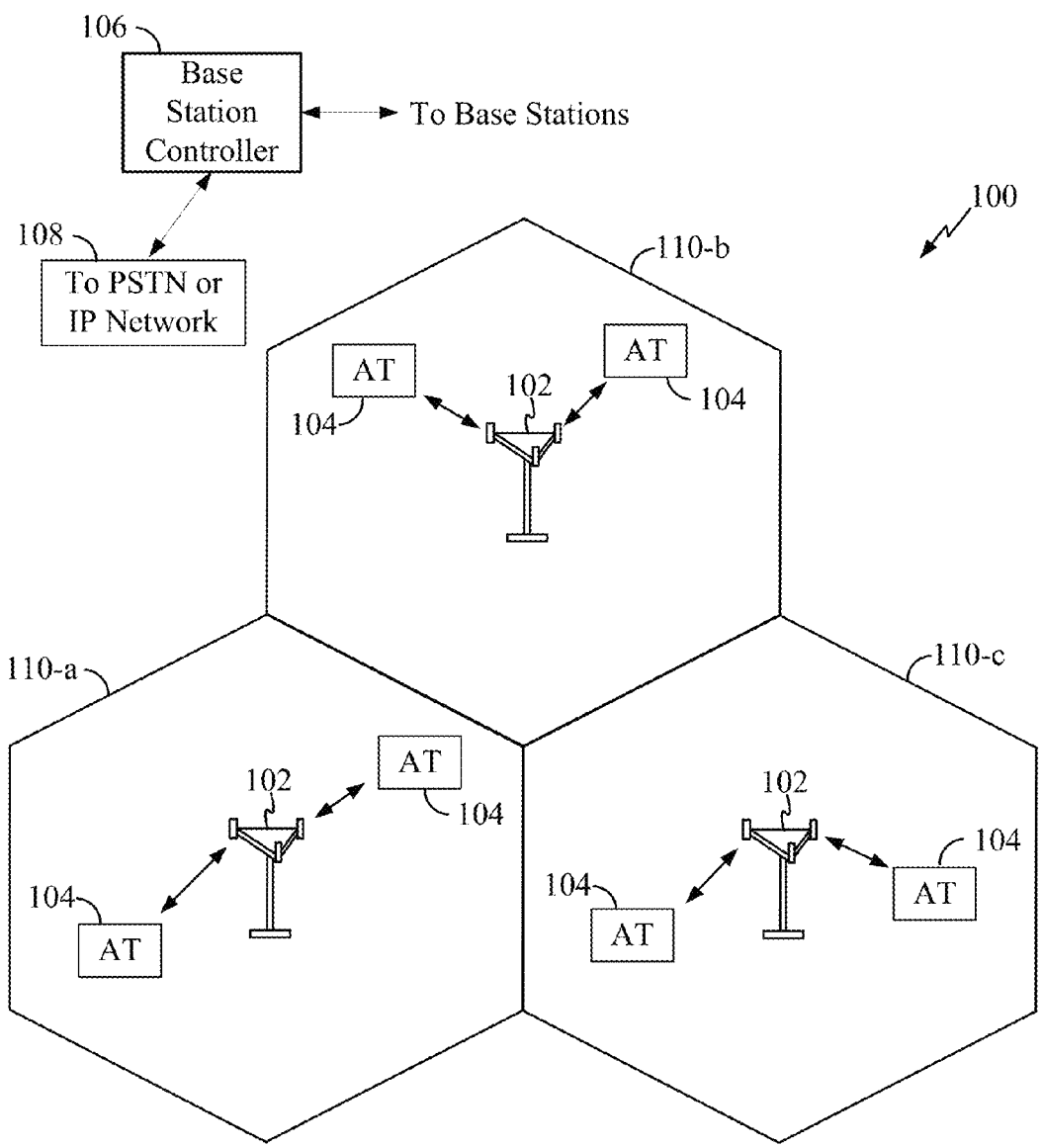
FIG. 1 is a block diagram illustrating at least one example of a network environment in which one or more aspects of the present disclosure may find application.

According to at least one aspect of the present disclosure, communications devices are provided that are adapted to decode a convolutional coded bit stream according to one or more of the features disclosed herein. FIG. 1 is a block diagram illustrating at least one example of a network environment in which one or more aspects of the present disclosure may find application. The wireless communication system 100 is adapted to facilitate wireless communication between a plurality of wireless communication devices, including base stations 102 and access terminals 104. The wireless communication system 100 can further include one or more base station controllers (BSC) 106, and a core network 108 providing access to a public switched telephone network (PSTN) (e.g., via a mobile switching center/visitor location register (MSC/VLR)) and/or to an IP network (e.g., via a packet data switching node (PDSN)).

The wireless communication devices (e.g., the base stations 102 and access terminals 104) may be adapted to interact with one another through wireless signals. In some instances, such wireless interaction may occur on multiple carriers (waveform signals of different frequencies). Multi-carrier transmitters can transmit modulated signals simultaneously on the multiple carriers. Each modulated signal may be a CDMA signal, a TDMA signal, an OFDMA signal, a Single Carrier Frequency Division Multiple Access (SC-FDMA) signal, etc. Each modulated signal may be sent on a different carrier and may carry control information (e.g., pilot signals), overhead information, data, etc.

The base stations 102 may wirelessly communicate with the access terminals 104 via a base station antenna. The base stations 102 may each include a device that facilitates wireless connectivity (for one or more access terminals 104) to a communications network. The base stations 102 may also be referred to by those of ordinary skill in the art as access points, base transceiver stations (BTS), radio base stations, radio transceivers, transceiver functions, basic service sets (BSS), extended service sets (ESS), Node Bs, femto cells, pico cells, and/or some other suitable terminology.

The base stations 102 are configured to communicate with the access terminals 104 under the control of the base station controller 106 via multiple carriers. Each of the base stations 102 can provide communication coverage for a respective geographic area. The coverage area 110 for each base station 102 here is identified as cells 110-a, 110-b, or 110-c. The coverage area 110 for a base station 102 may be divided into sectors (not shown, but making up only a portion of the coverage area). In a coverage area 110 that is divided into sectors, the multiple sectors within a coverage area 110 can be formed by groups of antennas with each antenna responsible for communication with one or more access terminals 104 in a portion of the cell.

The access terminals 104 may be dispersed throughout the coverage areas 110, and may wirelessly communicate with one or more sectors associated with each respective base station 102. An access terminal 104 may also be referred to by those skilled in the art as a mobile station (MS), a subscriber station, a mobile unit, a subscriber unit, a wireless unit, a remote unit, a mobile device, a wireless device, a wireless communications device, a remote device, a mobile subscriber station, a user equipment (UE), a mobile terminal, a wireless terminal, a remote terminal, a handset, a terminal, a user agent, a mobile client, a client, a machine-to-machine device, or some other suitable terminology. Some non-limiting examples of access terminals 104 include mobile phones, pagers, wireless modems, personal digital assistants (PDAs), personal information managers (PIMs), personal media players, palmtop computers, laptop computers, tablet computers, televisions, appliances, e-readers, digital video recorders (DVRs), and/or other communication/computing devices which communicate, at least partially, through a wireless or cellular network.

The wireless communications devices (e.g., base stations 102 and access terminals 104) may wirelessly communicate information by transmitting binary bits over an air interface from one device to another. To compensate for bit errors caused by noise and interference over the air interface, the wireless communications devices may implement channel coding to provide for error detection and correction. For instance, in examples where the wireless communication system 100 is adapted to implement Global System for Mobile Communications (GSM) radio technology, the wireless devices may employ a half-rate (1/2-rate) convolutional coding scheme. For example, on a common control channel, 228 bits of data (e.g., 184 information bits, a 40-bit CRC checksum calculated to verify the correct transmission of at least some of the information bits, and 4 tail bits) can be half-rate convolutional coded to obtain a 456-bit data block. The 456-bit data block may be block interleaved and mapped to four bursts of 114 bits.

The four bursts may be received at a wireless communications device, where a data stream is de-interleaved and decoded. According to at least one feature of the present disclosure, communication devices (e.g., the wireless communications devices in the system 100), can be adapted to decode a convolutional coded bit stream employing at least in part what may be referred to herein as algebraic decoding. In some embodiments, algebraic decoding can include determining, for example, a binary value for each information bit. In some embodiments, this can be accomplished by calculating a modulo 2 sum of a coded data bit added to one or more other coded data bits, one or more previously calculated information bits, or some combination thereof.

Although the network environment illustrated in FIG. 1 is a wireless communication network, the principles of the present disclosure may be applied to any wired and/or wireless communications system that employs convolutional coding of conveyed messages. Furthermore, although only half-rate convolutional coding is referred to above, it will be apparent from the examples below that various features of the present disclosure may find application with other convolutional coding schemes, such as 1/3-rate convolutional coding schemes employed with Enhanced General Packet Radio Service (EGPRS) channels, as well as other convolutional coding schemes. In short, embodiments of the present invention can be provisioned with many communication networks employing various communication protocols.

Figure 2:
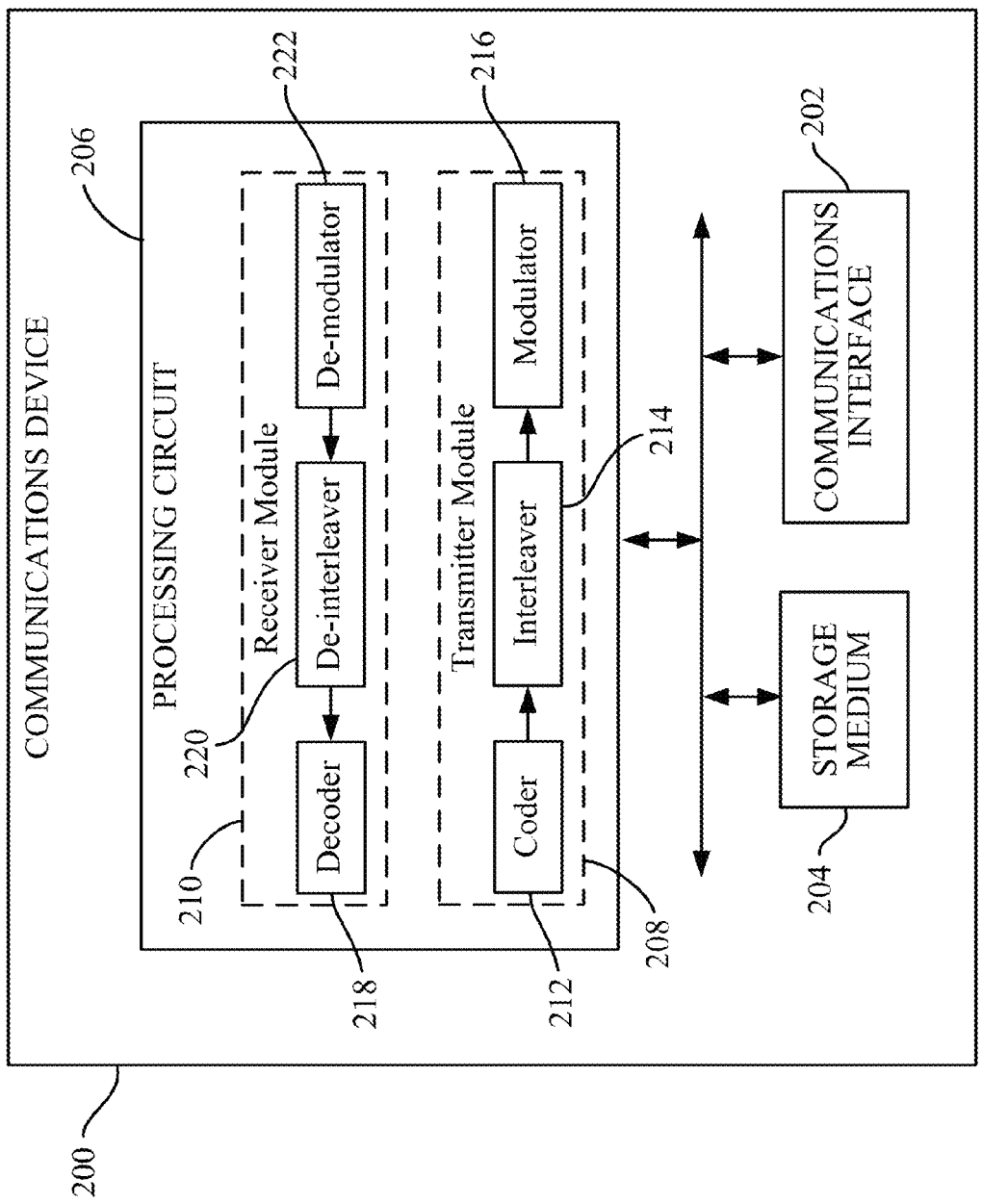
FIG. 2 is a block diagram illustrating select components of a communications device according to at least one example of the present disclosure.

Referring to FIG. 2, a block diagram is shown illustrating select components of a communications device 200 according to at least one example of the present disclosure. Such a communications device 200 may be implemented, for example as one or more of the wireless communications devices described above with reference to FIG. 1. The communications device 200 includes a communications interface 202 and a storage medium 204. These components can be both coupled to or placed in electrical communication a processing circuit 206.

The communications interface 202 is configured as an interface for wireless and/or wired communications mediums. For example, the communications interface 202 may be configured to communicate information bi-directionally with respect to other communications devices in a network. The communications interface 202 may be coupled with an antenna (not shown) for wireless communications with wireless communications network, and/or may include as a network interface card (NIC), a serial or parallel connection, a Universal Serial Bus (USB) interface, a Firewire interface, a Thunderbolt interface, or any other suitable arrangement for communicating with respect to public and/or private networks, as well as some combination thereof. The interface 202 can be configured as standalone receivers or transmitters or transceivers.

The storage medium 204 may represent one or more devices for storing programming and/or data, such as processor executable code or instructions (e.g., software, firmware), electronic data, databases, or other digital information. The storage medium 204 may also be used for storing data that is manipulated by the processing circuit 206 when executing programming. The storage medium 204 may be any available media that can be accessed by a general purpose or special purpose processor. By way of example and not limitation, the storage medium 204 may include a non-transitory computer-readable medium such as a magnetic storage device (e.g., hard disk, floppy disk, magnetic strip), an optical storage medium (e.g., compact disk (CD), digital versatile disk (DVD)), a smart card, a flash memory device (e.g., card, stick, key drive), random access memory (RAM), read only memory (ROM), programmable ROM (PROM), erasable PROM (EPROM), electrically erasable PROM (EEPROM), a register, a removable disk, and/or other non-transitory computer-readable mediums for storing information, as well as any combination thereof.

The storage medium 204 may be coupled to the processing circuit 206 such that the processing circuit 206 can read information from, and write information to, the storage medium 204. That is, the storage medium 204 can be coupled to the processing circuit 206 so that the storage medium 204 is at least accessible by the processing circuit 206, including examples where the storage medium 204 is integral to the processing circuit 206 and/or examples where the storage medium 204 is separate from the processing circuit 206.

Programming stored by the storage medium 204, when executed by the processing circuit 206, causes the processing circuit 206 to perform one or more of the various functions and/or process steps described herein. The processing circuit 206 is generally adapted for processing, including the execution of such programming stored on the storage medium 204. As used herein, the term "programming" shall be construed broadly to include without limitation executable instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise. Throughout the present disclosure, any reference to programming in relation to one or more features of the processing circuit 206 can include programming stored by the storage medium 204.

The processing circuit 206 is arranged to obtain, process and/or send data, control data access and storage, issue commands, and control other desired operations. The processing circuit 206 may include circuitry configured to implement desired programming provided by appropriate media in at least one embodiment. For example, the processing circuit 206 may be implemented as one or more processors, one or more controllers, and/or other structure configured to execute executable programming Examples of the processing circuit 206 may include a general purpose processor, a digital signal processor (DSP), an application specific integrated circuit (ASIC), a field programmable gate array (FPGA) or other programmable logic component, discrete gate or transistor logic, discrete hardware components, or any combination thereof designed to perform the functions described herein. A general purpose processor may include a microprocessor, as well as any conventional processor, controller, microcontroller, or state machine. The processing circuit 206 may also be implemented as a combination of computing components, such as a combination of a DSP and a microprocessor, a number of microprocessors, one or more microprocessors in conjunction with a DSP core, an ASIC and a microprocessor, or any other number of varying configurations. These examples of the processing circuit 206 are for illustration and other suitable configurations within the scope of the present disclosure are also contemplated.

According to one or more aspects of the present disclosure, the processing circuit 206 may be adapted to perform any or all of the features, processes, functions, steps and/or routines for any or all of the communications devices described herein. As used herein, the term "adapted" in relation to the processing circuit 206 may refer to the processing circuit 206 being one or more of configured, employed, implemented, and/or programmed (e.g., in combination with programming stored by the storage medium 204) to perform a particular process, function, step and/or routine according to various features described herein.

According to at least one example of the communications device 200, the processing circuit 206 may include a transmitter module 208 and a receiver module 210 for facilitating bi-directional communications with one or more other devices. The transmitter module 208 may also be referred to as a transmit processor, a transmit circuit, a transmitter chain, or other suitable terminology by those skilled in the art. The transmitter module 208 may include circuitry and/or programming adapted to provide various signal processing functions for transmitting data. By way of example and not limitation, the transmitter module 208 can include a coder 212, an interleaver 214 and a modulator 216.

Figure 3:
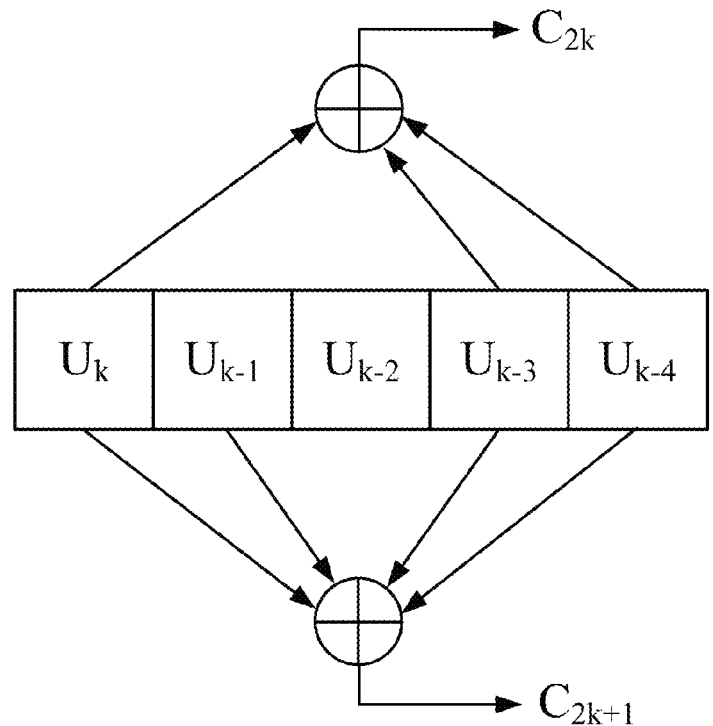
FIG. 3 is a diagram illustrating a graphical depiction of the equations for calculating half-rate convolutional coded bits $C_{2k}$ and $C_{2k+1}$ according to at least one example using generator polynomials $G_0=1+D^3+D^4$ and $G_1=1+D+D^3+D^4$.

The coder 212 may represent circuitry and/or programming adapted to add error detection and correction information to a bit stream. For example, the coder 212 may employ a convolutional code algorithm to combine a plurality of information bits from a bit stream (or data stream) to obtain a plurality of coded bits (or symbols). By way of example and not limitation, the coder 212 may employ half-rate (1/2-rate) convolutional coding according to a generator polynomials such as $G_0=1+D^3+D^4$, and $G_1=1+D+D^3+D^4$ to obtain the coded bits. Using these example generator polynomials, the coder 212 can calculate coded bits (or symbols) from the information bits $U_k$, $U_{k-1}$, $U_{k-2}$, $U_{k-3}$ and $U_{k-4}$ according to the following equations: $C_{2k}=U_k+U_{k-3}+U_{k-4}$ and $C_{2k+1}=U_k+U_{k-1}+U_{k-3}+U_{k-4}$, where the addition represents modulo 2 addition. These equations are depicted graphically by the diagram illustrated in FIG. 3.

Figure 4:
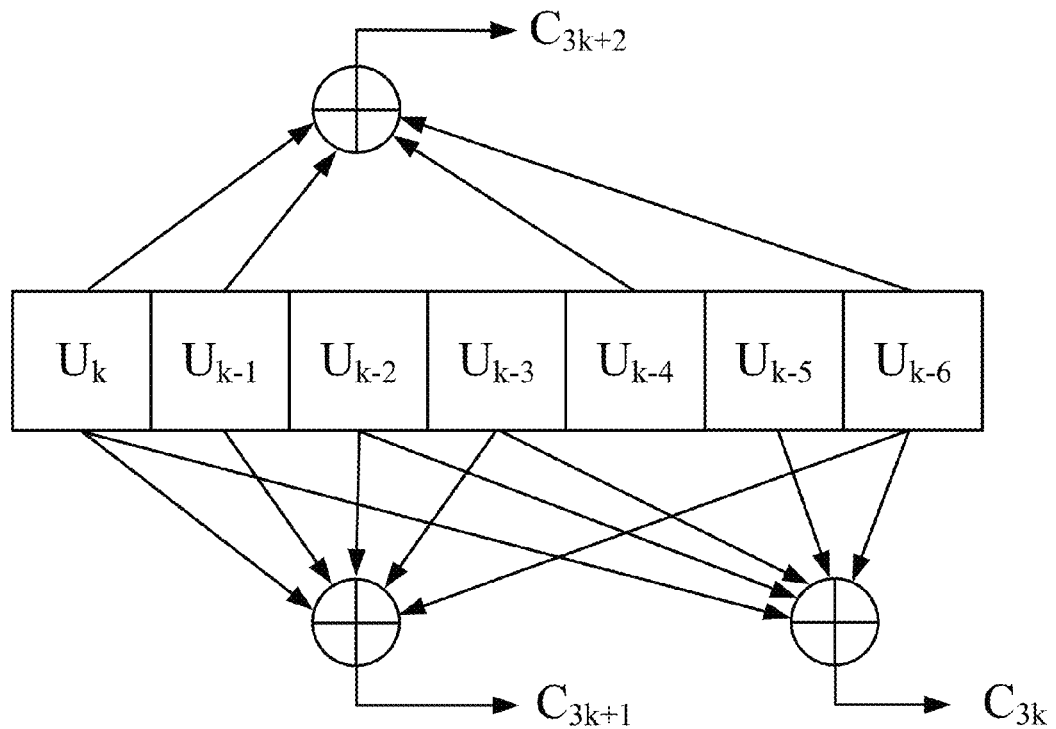
FIG. 4 is a diagram illustrating a graphical depiction of the equations for calculating one-third-rate convolutional coded bits $C_{3k}$, $C_{3k+1}$, and $C_{3k+2}$ according to at least one example using generator polynomials $G_4=1+D^2+D^3+D^5+D^6$, $G_7=1+D+D^2+D^3+D^6$, and $G_5=1+D+D^4+D^6$.

In another example, the coder 212 may employ a one-third-rate (1/3-rate) convolutional coding according to generator polynomials such as $G_4=1+D^2+D^3+D^5+D^6$, $G_7=1+D+D^2+D^3+D^6$, and $G_5=1+D+D^4+D^6$ to obtain the coded bits. Using these example generator polynomials, the coder 212 can calculate coded bits (or symbols) from the information bits $U_k$, $U_{k-1}$, $U_{k-2}$, $U_{k-3}$, $U_{k-4}$, $U_{k-5}$, and $U_{k-6}$ according to the following equations: $C_{3k}=U_k+U_{k-2}+U_{k-3}+U_{k-5}+U_{k-6}$, $C_{3k+1}=U_k+U_{k-1}+U_{k-2}+U_{k-3}+U_{k-6}$, and $C_{3k+2}=U_k+U_{k-1}+U_{k-4}+U_{k-6}$, where the addition again represents modulo 2 addition. These equations are depicted graphically by the diagram illustrated in FIG. 4.

Referring again to FIG. 2, the redundancy added by the coder 212 can facilitate correction for a high number of faulty bits per frame. If several consecutive bits are changed during transmission, however, a receiving device may not be able to correctly reconstruct an originally sent frame from a received frame. To decrease this effect, the interleaver 214 may represent circuitry and/or programming adapted to change the bit order in a specified pattern over a plurality of bursts.

The coded and interleaved bit stream can subsequently be prepared for transmission by the modulator 216. The modulator 216 may represent circuitry and/or programming adapted to prepare the coded and interleaved bit stream for transmission via the communications interface 202. For example, in one or more implementations for wireless communications, the modulator 216 may map the bit stream to signal constellations based on various modulation schemes (e.g., Gaussian minimum shift keying (GMSK), binary phase-shift keying (BPSK), quadrature phase-shift keying (QPSK), M-phase-shift keying (M-PSK), M-quadrature amplitude modulation (M-QAM), and the like), spreading with orthogonal variable spreading factors (OVSF), and multiplying with scrambling codes to produce a series of symbols. The symbols may then be employed by the modulator 216 in creating a frame structure. The modulator 216 can then apply various signal conditioning functions to the frames, such as amplification, filtering, and modulating the frames onto a carrier for transmission of the bit stream over a particular medium via the communications interface 202 (e.g., a wireless medium through an antenna associated with the communications interface 202).

Referring still to FIG. 2, the receiver module 210, which may also be referred to by those skilled in the art as a receive processor, receive circuit, receiver chain, or other suitable terminology, may include circuitry and/or programming adapted to provide various signal processing functions for recovering transmitted data. By way of example and not limitation, the receiver module 210 can include a decoder 218, a de-interleaver 220 and a de-modulator 222.

The de-modulator 222 may represent circuitry and/or programming adapted to recover information modulated onto the carrier. As a bit stream is received via the communications interface 202, the received bit stream is initially de-modulated by the de-modulator 222. Continuing with the non-limiting example where communications include wireless transmissions, the de-modulator 222 may further parse each frame, descramble and despread the symbols, and determine the most likely signal constellation points based on the modulation scheme.

The de-interleaver 220 may represent circuitry and/or programming adapted to re-order the bits into their original order. With the bit stream processed by the de-modulator 222 and re-ordered by the de-interleaver 220, the bit stream can be provided to the decoder 218.

Figure 5:
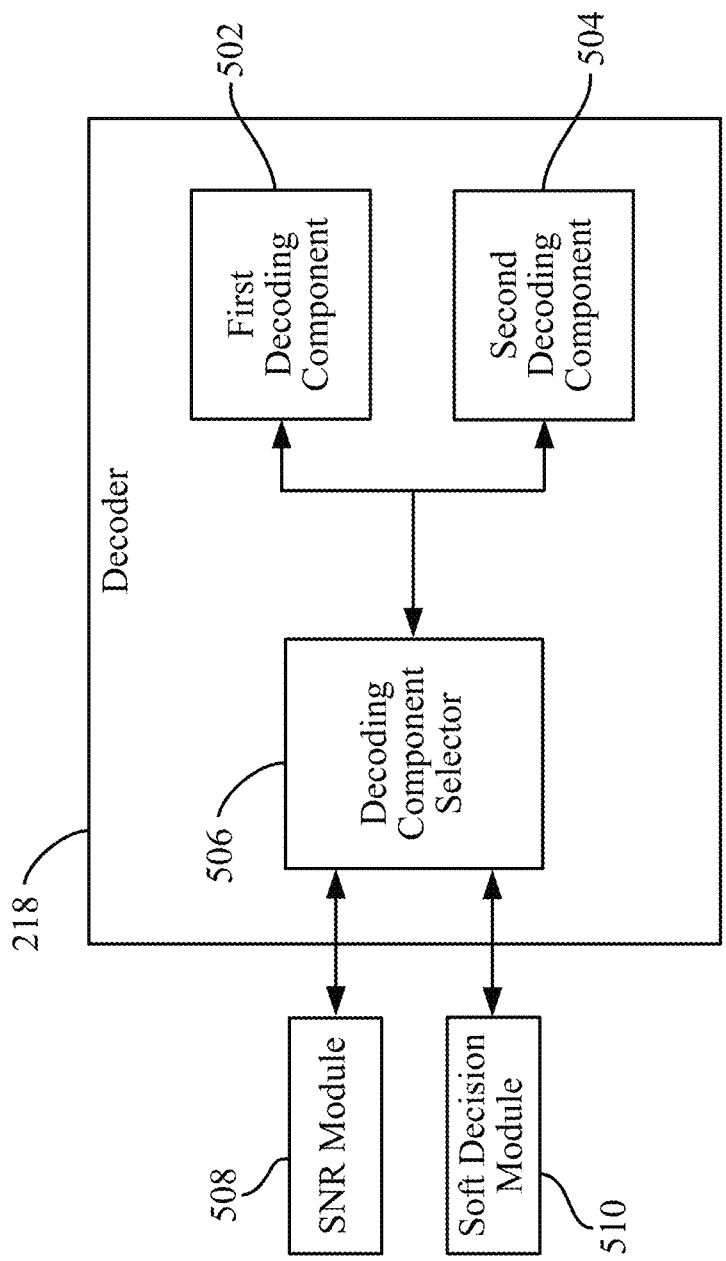
FIG. 5 is a block diagram illustrating select components of a decoder according to at least one example of the disclosure.

The decoder 218 may represent circuitry and/or programming adapted to obtain information bits from the coded bits (or symbols). According to an aspect of the present disclosure, the decoder 218 may include a first decoding component 502 and a second decoding component 504, as depicted in FIG. 5, which is a block diagram illustrating select components of the decoder 218 according to at least one example. The decoder 218 also includes a decoding component selector 506 that can be coupled to, and may cooperate with, a signal-to-noise ratio (SNR) module 508 and/or a soft decisions module 510.

The first decoding component 502 may represent circuitry and/or programming adapted to decode a convolutional coded bit stream using modulo 2 addition. More particularly, the first decoding component 502 can be adapted to determine a binary value for each information bit by calculating the modulo 2 sum of a coded data bit added to one or more other coded data bits, one or more previously calculated information bits, or some combination thereof. The particulars of the calculation may be determined from the equations used to calculate the coded data bits from the information bits.

The second decoding component 504 may represent circuitry and/or programming adapted to decode a convolutional coded bit stream by at least partially employing a conventional convolutional decoding algorithm. By way of example and not limitation, the second decoding component 504 may comprise a Viterbi decoder adapted to decode a convolutional coded bit stream with Viterbi decoding.

The decoding component selector 506 may represent circuitry and/or programming adapted to select between the first decoding component 502 and the second decoding component 504 for decoding a received bit stream. According to at least one example, the decoding component selector 506 can be adapted to select the first decoding component 502 when the received bit stream exhibits sufficiently high signal quality. For instance, if a value for signal-to-noise ratio (SNR) is above a threshold and/or absolute values for soft decisions are above a predetermined threshold, the decoding component selector 506 may be adapted to select the first decoding component to decode the coded bit stream. If, however, the signal quality is not sufficiently high (e.g., soft decisions and/or SNR below threshold), then the decoding component selector 506 may be adapted to select the second decoding component 504. In some instances, the decoding component selector 506 may also take into account the bit error rate in determining the signal quality.

The signal-to-noise ratio (SNR) module 508 may represent circuitry and/or programming included with the processing circuit 206 to determine the signal-to-noise ratio associated with a received bit stream. The signal-to-noise ratio (SNR) module 508 can provide the signal-to-noise ratio (SNR) values for the decoding component selector 506 to use in determining which decoding component to select.

The soft decision module 510 can represent circuitry and/or programming included with the processing circuit 206 to determine soft decision values. A received coded bit stream may include information about the reliability of each received coded bit (or symbol). Using this information from the received coded bit stream, soft decisions can be determined based on channel estimates. The soft decision module 510 can provide values for the soft decisions for the decoding component selector 506 to use in determining which decoding component to select for a particular coded bit stream. In various instances, these soft decisions may be either positive or negative values. Accordingly, the soft decision module 510 may be adapted to provide an absolute value for the soft decisions associated with the coded bits of the bit stream to the decoding component selector 506.

Figure 6:
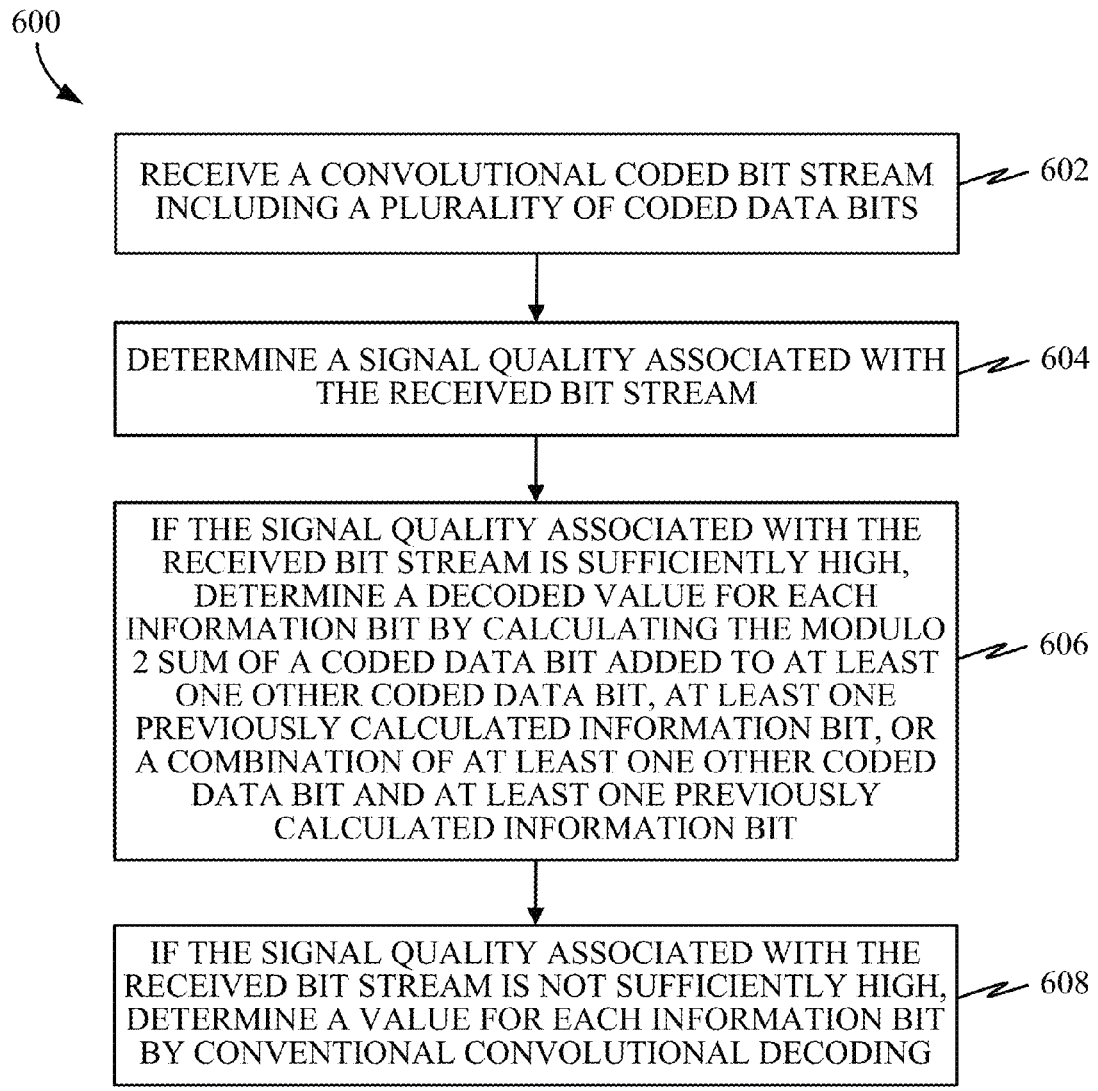
FIG. 6 is a flow diagram illustrating a method operational on a communications device including a decoder with a first decoding component and a second decoding component, according to at least one implementation.

Referring to FIG. 6, a flow diagram is illustrated showing an example of a method 600 operational on a communications device, such as the communications device 200 including a decoder 218. Referring to FIGS. 2, 5 and 6, a communications device 200 may receive a convolutional coded bit stream including a plurality of coded data bits at step 602. For example, the processing circuit 206 may receive the convolutional coded bit stream via the communications interface 202. As noted above, such a received convolutional coded bit stream may be de-modulated at the de-modulator 222 and de-interleaved at the de-interleaver 220.

At step 604, the communications device 200 can determine a signal quality associated with the received bit stream. For instance, the processing circuit 206 may determine whether a signal-to-noise ratio associated with the coded bit stream is above a threshold value, whether a soft decision value for each of the plurality of coded data bits is above a threshold value, whether the bit error rate is below a threshold value, or some combination of the foregoing variables. By way of example and not limitation, the signal-to-noise ratio may be determined to be sufficiently high when this ratio is above 8 dB in one or more implementations or above 10 dB in one or more other implementations. In other embodiments, however, the specific threshold value for signal-to-noise ratio can be determined based on design choice. In examples where the soft decision values are employed, the threshold may vary according to the type of soft decision values provided. For instance, a soft decision value may be just a 1 or −1, or a soft decision value can be quantized over a plurality of values, such as between 8 and −8 for a four-bit soft decision value, or between 15 and −15 for a five-bit soft decision value, where a larger absolute value of the soft decision value represents a higher reliability relating to the associated bit. In at least one non-limiting example of a five-bit soft decision value, a threshold may be set at about 10, so that any coded bit exhibiting an absolute value for an associated soft decision value above 10 may be considered sufficiently high signal quality. In examples where the bit error rate is employed to determine the signal quality, a non-limiting example of a threshold may be less than about 0.01%.

In at least some examples, a signal quality determination may be carried out by the decoding component selector 506. The determination can be done in conjunction with information obtained from the SNR module 508 and/or the soft decision module 510. If the decoding component selector 506 determines the signal quality to be sufficiently high (e.g., the signal quality meets or exceeds one or more relevant thresholds), it may select the first decoding component 502 to decode the coded bit stream. If, on the other hand, the decoding component selector 506 determines that the signal quality is not sufficiently high (e.g., the signal quality falls below or meets one or more relevant thresholds), it may select the second decoding component 504 to decode the coded bit stream.

At step 606, if the signal quality associated with the received bit stream is sufficiently high, the communications device 200 can determine a value for each information bit at least by calculating the modulo 2 sum of a coded data bit added to at least one other coded data bit and/or at least one previously calculated information bit. For example, when the signal quality is sufficiently high (as described above), the decoding component selector 506 can select the first decoding component 502 to decode the coded bit stream. The first decoding component 502 is adapted to decode the coded bit stream using modulo 2 addition. As noted above, the particulars of such calculations may be determined from the equations used in convolutional coding data bits from the information bits prior to transmission.

At step 608, if the signal quality associated with the received bit stream is not sufficiently high (as described above), the communications device 200 can determine a value for each information bit by convolutional decoding. For example, when the signal quality is not sufficiently high, the decoding component selector 506 can select the second decoding component 504 to decode the coded bit stream. The second decoding component 504 is adapted to decode the coded bit stream using convolutional decoding techniques, such as Viterbi decoding.

Because the particulars of the calculations employed by the first decoding component 502 to decode a convolutional coded bit stream using modulo 2 addition can be determined from the equations used to perform the convolutional coding of the information bits prior to transmission, some examples are provided below to illustrate how such determinations can be made and employed according to the method 600. In other words, some examples of the method 600 are provided below according to some examples of specific generator polynomials used to convolutional code a bit stream. Although the following examples describe implementations of the method 600 for specific generator polynomials, it should be understood that the underlying principles employed in the particular examples can be applied for a variety of different generator polynomials.

In a first example, a bit stream may be half-rate (1/2-rate) convolutional coded according to the generator polynomials $G_0=1+D^3+D^4$, and $G_1=1+D+D^3+D^4$ to obtain the coded bits. Such generator polynomials may be employed in a wireless communications network for wireless transmissions between communications devices. For example, these generator polynomials may be employed in a wireless communications network adapted to implement radio technology such as Global System for Mobile Communications (GSM). As noted above, FIG. 3 illustrates a graphical depiction of the equations employed under these generator polynomials. In particular, the coded bits (or symbols) $C_{2k}$ and $C_{2k+1}$ are calculated from the information bits $U_k$, $U_{k-1}$, $U_{k-2}$, $U_{k-3}$ and $U_{k-4}$ according to the following equations: $C_{2k}=U_k+U_{k-3}+U_{k-4}$ and $C_{2k+1}=U_k+U_{k-1}+U_{k-3}+U_{k-4}$, where the addition represents modulo 2 addition.

These two equations can be expressed as the polynomials $C(D)=U(D)G(D)$, which can be expressed as $C(D)=U(D)[1+D^3+D^4, 1+D+D^3+D^4]$ by replacing the generator polynomials for G(D).

Letting F(D) be the right inverse polynomial of G(D) results in $C(D)F(D)=U(D)G(D)F(D)=U(D)D^\alpha$, where the value for 'α' greater than or equal to zero (0) (i.e., α≥0) represents the delay.

One candidate polynomial for F(D) is $F(D)=[1\ 1]^T$, which results in $C(D)F(D)=U(D)[1+D^3+D^4, 1+D+D^3+D^4][1\ 1]^T=U(D)D$.

Figures 7, 8, 9:
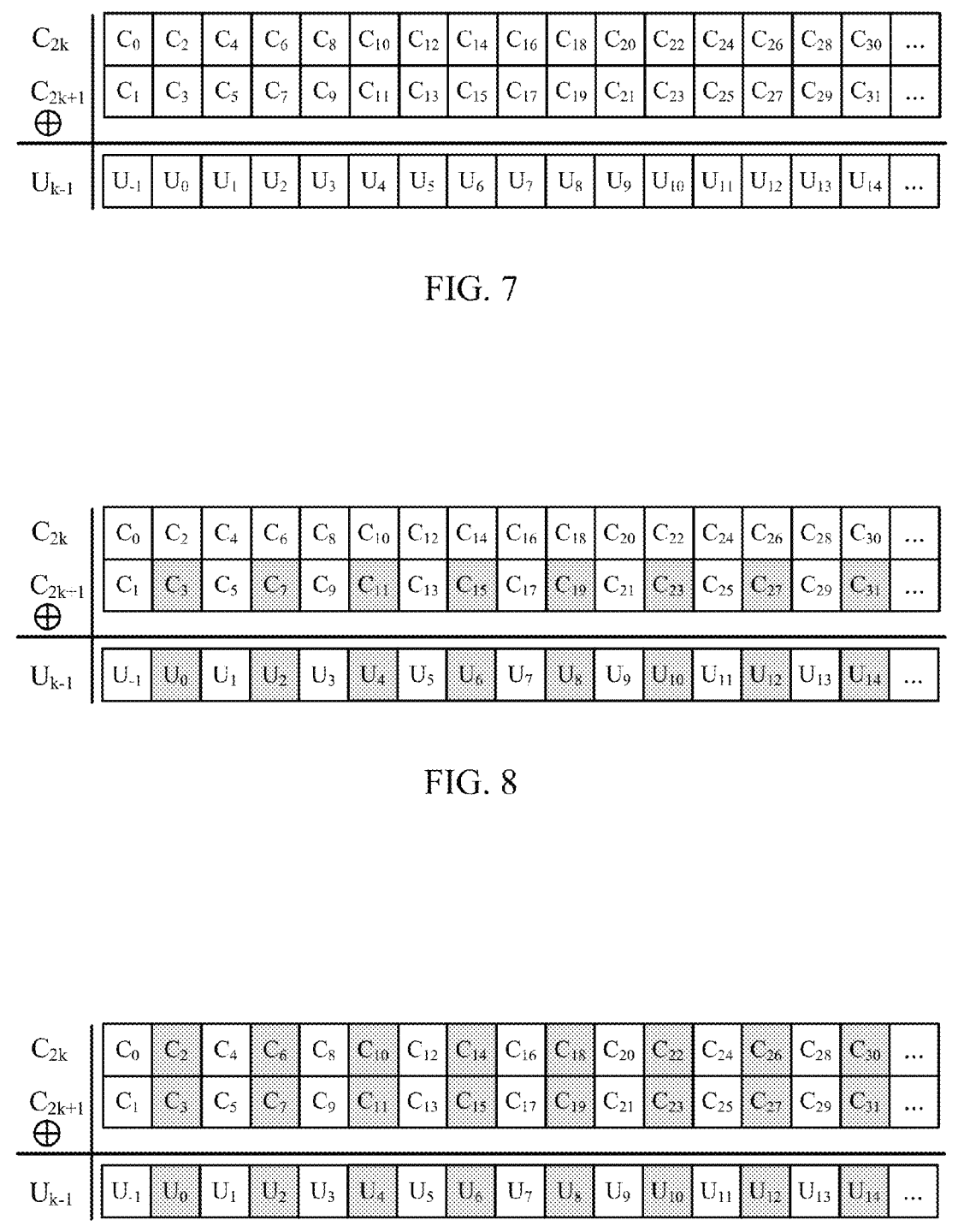

A simple optimization involves calculating the modulo 2 sum of the coded bits $C_{2k}$ and $C_{2k+1}$ to obtain the information bit $U_{k-1}$ (i.e., $U_{k-1}=C_{2k}+C_{2k+1}$). Thus, the forgoing expressions show that each information bit $U_{k-1}$ can be determined by simple algebraic calculations. For example, as a plurality of coded bits 'C' are received at the first decoding component 502, the coded bits C can be employed as shown in FIG. 7 to calculate information bits 'U'. That is, each information bit $U_{k-4}$ can be determined by calculating the modulo 2 sum of $C_{2k}+C_{2k+1}$.

As previously noted, a received coded bit stream may be interleaved to decrease the effect of consecutive bits being corrupted during transmission. For example, a 456-bit data block associated with the bit stream depicted by FIG. 7 may be interleaved and mapped to four individual bursts, with a first burst including some combination of the coded bits $C_0$, $C_4$, $C_8$, etc, a second burst including coded bits $C_1$, $C_5$, $C_9$, etc., a third burst including coded bits $C_2$, $C_6$, $C_{10}$, etc., and a fourth bust including coded bits $C_3$, $C_7$, $C_{11}$, etc. The order of the coded data bits in each burst may vary according to various examples and implementations. Furthermore, the particular coded data bits included in each of the bursts may vary in different examples. For instance, the first burst may include some combination of the coded data bits $C_1$, $C_5$, $C_9$, etc. and the second burst may include some combination of the coded bits $C_0$, $C_4$, $C_8$, etc, and so forth for the various bursts. Thus, although only one example of interleaving is described in the following examples of half-rate convolutional coded data, the particular algorithm employed for interleaving can vary according to various examples.

In the example shown in FIG. 7, it is assumed that all the coded bits are received with sufficient quality. In some instances, however, not all of the coded bits from a data block are available. As used herein, the term "available" with relation to coded bits refers to the coded bits being both received at the decoder 218 and having a signal quality (e.g., signal-to-noise ratio, soft decision value, etc.) above a predetermined threshold. For instance, in a wireless communications implementation, not all coded bits are available from a data block when an early page decoding is employed and the coded bits are decoded prior to receiving all the bursts of a data block (e.g., only 2 of 4 or 3 of 4 bursts are received). In other instances, coded bits in one or more bursts of the data block are not available when the quality of the received signal (e.g., signal-to-noise ratio, soft decision value, etc.) is too low to reliably determine the coded data received in one or two bursts of the data block using the algebraic decoding schemes referred to herein. In the case where at least two continuous bursts in the block are received with sufficiently good signal quality, then the block can be decoded at the first decoding component 502 by employing a modification to the equations depicted by FIG. 7.

FIG. 8 is a block diagram illustrating an example where only three of four bursts are available. As illustrated, the fourth burst of the data block is unavailable. For instance, the fourth burst may not have been received yet (e.g., early decoding), or the fourth burst may have poor signal quality. The shaded boxes of FIG. 8 depict the missing coded bits 'C'. Using equation $U_{k-1}=C_{2k}+C_{2k+1}$ in the first decoding component 502, the decoder 218 can calculate a binary value for each of the information bits $U_{2k-1}$ (e.g., every other value of $U_{k-1}$). In other words, half of the information bits can be calculated according to the equation $U_{2k-1}=C_{2(2k)}+C_{2(2k)+1}=C_{4k}+C_{4k+1}$. However, the information bits $U_{2k}$ are not capable of being calculated with the previous equation as a result of the unavailable coded bits.

To obtain the values for the information bits $U_{2k}$, the previous equation $U_{k-1}=C_{2k}+C_{2k+1}$ can be modified. As noted previously, the equation for coding $C_{2k}$ is $C_{2k}=U_k+U_{k-3}+U_{k-4}$.

Substituting the variable 'k' with 2p−1, where the value of p is equal to the number 'n' of bits in each burst (e.g., p=1, 2, . . . , 114 for 114-bit bursts), results in the equation $C_{2(2p-1)}=U_{2p-1}+U_{2(p-2)}+U_{2p-5}$.

Solving for $U_{2(p-2)}$ for modulo 2 calculations results in the equation $U_{2(p-2)}=C_{2(2p-1)}+U_{2p-1}+U_{2p-5}$.

Letting p−2=k, we get $U_{2k}=C_{2(2k-3)}+U_{2k+3}+U_{2k-1}$.

Thus, given the forgoing, the information bits $U_{2k-1}$ can each be calculated according to the equation $C_{2(2k)}+C_{2(2k)+1}=C_{4k}+C_{4k+1}$, for each value of 'k' 1 through 'n' number of bits in each burst (e.g., 1 through 114 for a block including 114-bit bursts). After obtaining all of the values for $U_{2k-1}$, the values for $U_{2k}$ can be obtained by calculating the modulo 2 sum of $C_{2(2k+3)}+U_{2k+3}+U_{2k-1}$ for each value of 'k' equal to 0 through 'n−1' (e.g., 0, 1, 2, . . . , 113 for a block including 114-bit bursts). For example, $$U_0=C_6+U_3+U_{-1},$$

$$U_2=C_{10}+U_5+U_1,$$

$$U_4=C_{14}+U_7+U_3,\ \text{etc.}$$

Accordingly, the binary value for each information bit $U_{2k}$ is determined by calculating the modulo 2 sum of the encoded data bit $C_{2(2k+3)}$ with the previously determined information bits $U_{2k+3}$ and $U_{2k-1}$.

Turning to FIG. 9, another block diagram is illustrated, showing an example where only two consecutive bursts are available. For instance, the third and fourth bursts of the data block are unavailable in this example. Such an example may occur when early decoding is employed with the first two bursts, or where bursts 3 and 4 are received with poor signal quality. The shaded boxes in FIG. 9 represent the missing coded bits 'C', and the information bits 'U' that are not determinable by the original equation $U_{k-1} = C_{2k} + C_{2k+1}$.

Using equation $U_{k-1} = C_{2k} + C_{2k+1}$ in the first decoding component 502, the decoder 218 can calculate a binary value for each of the information bits $U_{2k-1}$ (e.g., every other value of $U_{k-1}$). In other words, half of the information bits can be calculated according to the equation $U_{2k-1} = C_{2(2k)} + C_{2(2k)+1} = C_{4k} + C_{4k+1}$. However, the information bits $U_{2k}$ are not capable of being calculated with the previous equation as a result of the unavailable coded bits.

After obtaining all of the values for $U_{2-1}$, the values for $U_{2k}$ can be obtained by calculating the modulo 2 sum of $C_{4k} + U_{2k-3} + U_{2k-4}$ for k=0, 1, 2, ..., 113. For this equation, the value of $U_k$ when k is less than zero (0) is just equal to zero (0). Thus, for example, $$U_0 = C_0 + 0 + 0, \text{ or } U_0 = C_0,$$

$$U_0 = C_0 + 0 + 0, \text{ or } U_2 = C_4,$$

$$U_4 = C_8 + U_1 + U_0,$$

$$U_6 = C_{12} + U_3 + U_2, \text{ etc.}$$

Accordingly, the binary value for each information bit $U_{2k}$ is determined by calculating the modulo 2 sum of the encoded data bit $C_{4k}$ with the previously determined information bits $U_{2k-3}$ and $U_{2k-4}$.

As will be apparent by the foregoing examples, and as noted previously, the binary value for each of the information bits 'U' can be determined in the first decoding component 502 by modulo 2 addition of a coded data bit 'C' with some other binary value associated with the data stream (e.g., one or more other coded data bits 'C' and/or one or more previously determined information bits 'U').

Figure 10:
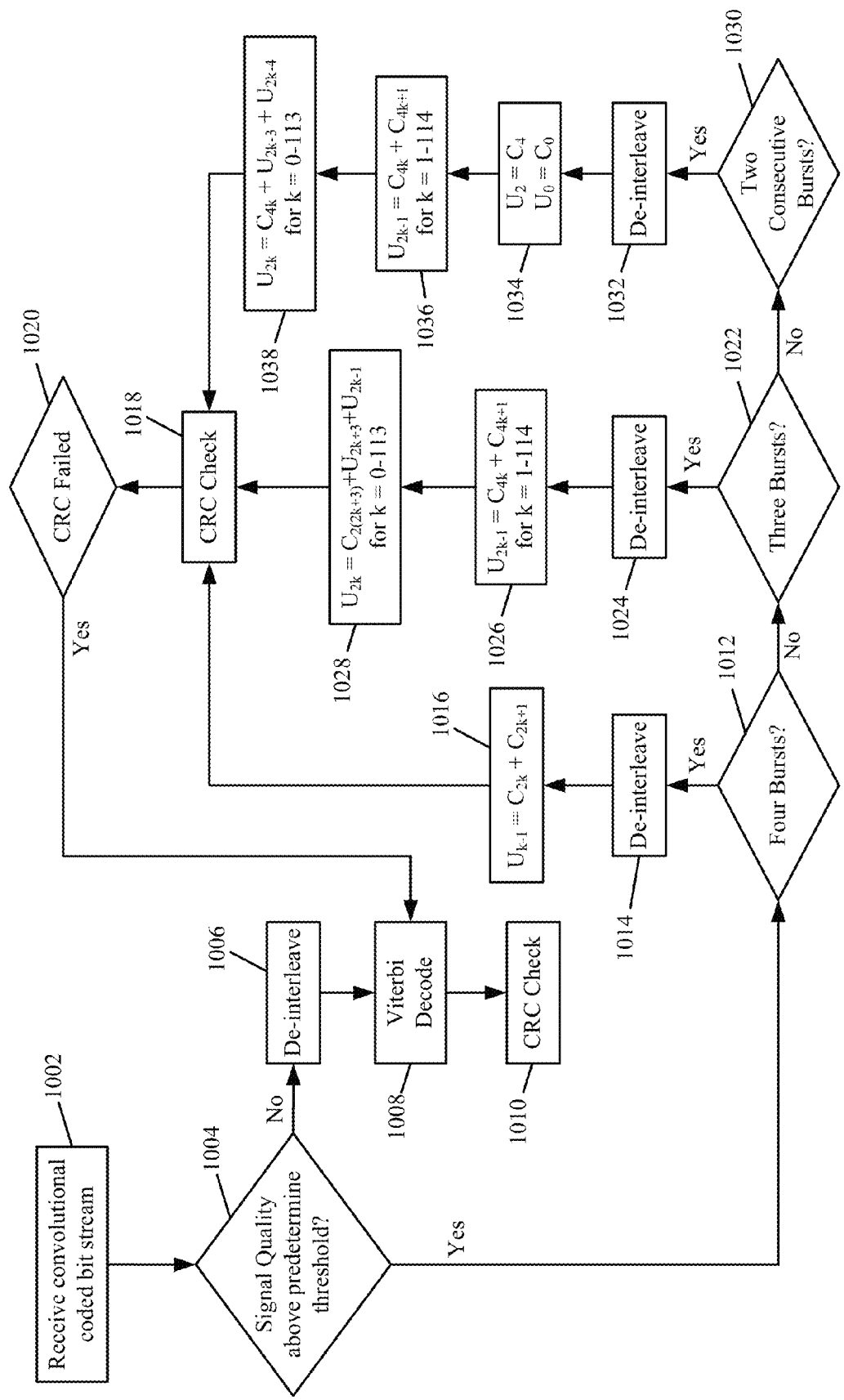
FIG. 10 is a flow diagram illustrating at least one implementation of a process that may be employed by a decoder to decode data that has been half-rate convolutional coded according to the generator polynomials referred to in FIG. 3.

FIG. 10 is a flow diagram illustrating at least one implementation of the method 600. The method 600 can be operational on a communications device 200 to decode data that has been half-rate convolutional coded. In some embodiments, the coding can be done according to the generator polynomials described above with reference to FIG. 3. Referring to FIGS. 2, 5 and 10, a convolutional coded bit stream may be received at operation block 1002. For example, the processing circuit 206 of the communications device 200 may receive a convolutional coded bit stream via the communications interface 202.

At decision diamond 1004, it can be determined whether received burst(s) have signal quality above a predetermined threshold. For instance, the decoding component selector 506 of the decoder 218 can obtain the soft decisions values from the soft decision module 510 and/or signal-to-noise ratio values from the SNR module 508 to determine whether the received burst(s) have values that are above a predetermined threshold, as well as a bit error rate below a predetermined threshold.

If the signal quality is not above a threshold, then conventional decoding can be employed. For example, the decoding component selector 506 can employ the second decoding component 504 to decode the coded bit stream with, for instance, a Viterbi decoder. In this case, the coded bit stream is de-interleaved at operation block 1006 by the de-interleaver 220, decoded by the second decoding component 504 (e.g., using Viterbi decoding at operation block 1008), and then a CRC check is performed on the decoded data at operation block 1010.

If the signal for the received bit stream is of sufficiently high quality at decision diamond 1004, then the decoding component selector 506 may select the first decoding component 502 to decode the coded bit stream. Initially, it is determined how many bursts of the data block are available. If all bursts of the coded bit stream (e.g., all four bursts of a four burst block) are determined to be available at decision diamond 1012, then the coded data is de-interleaved at block 1014 by a de-interleaver 220, and a decoded value for each information bit $U_{k-1}$ is determined by the first decoding component 502, which calculates the modulo 2 sum of the coded data bits $C_{2k} + C_{2k+1}$ at operation block 1016. A CRC check can be performed to the decoded data at block 1018. At decision diamond 1020, it is determined whether the CRC check failed. If the CRC check fails, the data can be subsequently decoded by the second decoding component 504 (e.g., using Viterbi decoding at block 1008).

If it is determined at decision diamond 1012 that there are not four bursts available, then the process goes to decision diamond 1022 to determine whether there are three bursts available. If there are three of the four bursts available, then the coded data is de-interleaved at block 1024 by the de-interleaver 220, and the information bit values for $U_{2k-1}$ can be determined by the first decoding component 502. That is, the first decoding component 502 can determine a decoded value for each information bit $U_{2k-1}$ by calculating the modulo 2 sum of the coded data bits $C_{4k} + C_{4k+1}$ for k=1, 2, ..., 114 at block 1026. After obtaining all of the values for information bits $U_{2k-1}$ at block 1026, the values for information bits $U_{2k}$ are obtained at block 1028 where the first decoding component 502 calculates the modulo 2 sum of $C_{2(2k+3)} + U_{2k+3} + U_{2k-1}$ for k=0, 1, 2, ..., 113. A CRC check can be performed to the decoded data at block 1018. At decision diamond 1020, it is determined whether the CRC check failed. If the CRC check fails, the data can be subsequently decoded by the second decoding component 504 (e.g., using Viterbi decoding at block 1008).

If it is determined at decision diamond 1022 that there are not three bursts available, then the process goes to decision diamond 1030 to determine whether there are two consecutive bursts available. If there are two consecutive bursts available from the four bursts, then the data is de-interleaved at block 1032 by the de-interleaver 220. At block 1034, it is determined that the value for information bit $U_0$ is equal to the coded bit $C_0$, and the value for the information bit $U_2$ is equal to the coded bit $C_4$. The first decoding component 502 can determine the decoded value for each information bit $U_{2k-1}$ at block 1036, by calculating the modulo 2 sum $C_{4k} + C_{4k+1}$ for k=1, 2, ..., 114. After obtaining the values for $U_{2k-1}$, the decoded values for each information bit $U_{2k}$ can be obtained at block 1038, where the first decoding component 502 calculates the modulo 2 sum of $C_{4k} + U_{2k-3} + U_{2k-4}$ for k=0, 1, 2, ..., 113. A CRC check can be performed to the decoded data at block 1018. At decision diamond 1020, it is determined whether the CRC check failed. If the CRC check fails, the data can be subsequently decoded by the second decoding component 504 (e.g., using Viterbi decoding at block 1008).

By employing algebraic decoding (as described herein) to decode a half-rate convolutional coded bit stream when the signal quality is sufficiently high, a communications device 200 can reduce the processing load on the processing circuit 206. According to some embodiments, the processing reduction can be significant relative to conventional decoding arrangements. For instance, in at least one example using a conventional Viterbi decoder (e.g., in the second decoding component 504), it may take about 8500 processing cycles to complete decoding of a half-rate convolutional coded data block of 456 bits. In contrast, at least one example of a first decoding component 502 implementing the algebraic decoding scheme discussed above may be capable of decoding the same 456-bit block in about 2400 processing cycles. This significant reduction in processing cycles can result in reduced power consumption, faster processing, lower thermal emission, as well as other or different benefits (relative to situations where a reduction in cycles is not achieved).

In another example, a bit stream may be one-third-rate (1/3-rate) convolutional coded according to the generator polynomials $G_4=1+D^2+D^3+D^5+D^6$, $G_7=1+D+D^2+D^3+D^6$, and $G_5=1+D+D^4+D^6$ to obtain the coded bits. Such generator polynomials may be employed in a wireless communications network for wireless transmissions between communications devices. For instance, these generator polynomials may be employed for wireless communications over Enhanced General Packet Radio Service (EGPRS) channels. As noted above, FIG. 4 illustrates a graphical depiction of the equations employed under these generator polynomials. In particular, the coded bits (or symbols) $C_{3k}$, $C_{3k+1}$, and $C_{3k+2}$ are calculated from the information bits $U_k$, $U_{k-1}$, $U_{k-2}$, $U_{k-3}$, $U_{k-4}$, $U_{k-5}$, and $U_{k-6}$ according to the following equations: $C_{3k}=U_k+U_{k-2}+U_{k-3}+U_{k-5}+U_{k-6}$, $C_{3k+1}=U_k+U_{k-1}+U_{k-2}+U_{k-3}+U_{k-6}$, and $C_{3k+2}=U_k+U_{k-1}+U_{k-4}+U_{k-6}$, where the addition represents modulo 2 addition.

Employing this relationship, it can be determined that each information bit $U_k$ can be calculated using one of three equations:

$$U_k=C_{3k}+U_{k-2}+U_{k-3}+U_{k-5}+U_{k-6},$$

$$U_k=C_{3k+1}+U_{k-1}+U_{k-2}+U_{k-3}+U_{k-6}, \text{ and}$$

$$U_k=C_{3k+2}+U_{k-1}+U_{k-4}+U_{k-6},$$

where $U_k=0$ when k is less than zero (0).

In this example, the communications device 200 of FIG. 2 (e.g., the decoder 218) may determine which of the received encoded symbols $C_{3k}$, $C_{3k+1}$, or $C_{3k+2}$ has the highest absolute value for its soft decision value. In at least one example, this may be determined by the decoding component selector 506 (see FIG. 5) and/or the first decoding component 502 (also in FIG. 5) in connection with the soft decision module 510 (also in FIG. 5).

If it is determined that the coded data bit $C_{3k}$ has the highest absolute value for its soft decision value, then $U_k$ can be calculated from the modulo 2 sum of $C_{3k}+U_{k-2}+U_{k-3}+U_{k-5}+U_{k-6}$. If the coded data bit $C_{3k+1}$ is determined to have the highest absolute value for its soft decision value, then $U_k$ can be calculated from the modulo 2 sum $C_{3k+1}+U_{k-1}+U_{k-2}+U_{k-3}+U_{k-6}$. Finally, if it is determined that the coded data bit $C_{3k+2}$ has the highest absolute value for its soft decision value, then $U_k$ can be calculated from the modulo 2 sum $C_{3k+2}+U_{k-1}+U_{k-4}+U_{k-6}$.

Thus, according to the present example, the binary value for each of the information bits 'U' can be determined in the first decoding component 502 by modulo 2 addition of a coded data bit 'C' with some other binary value associated with the data stream (e.g., one or more previously determined information bits 'U').

Figure 11:
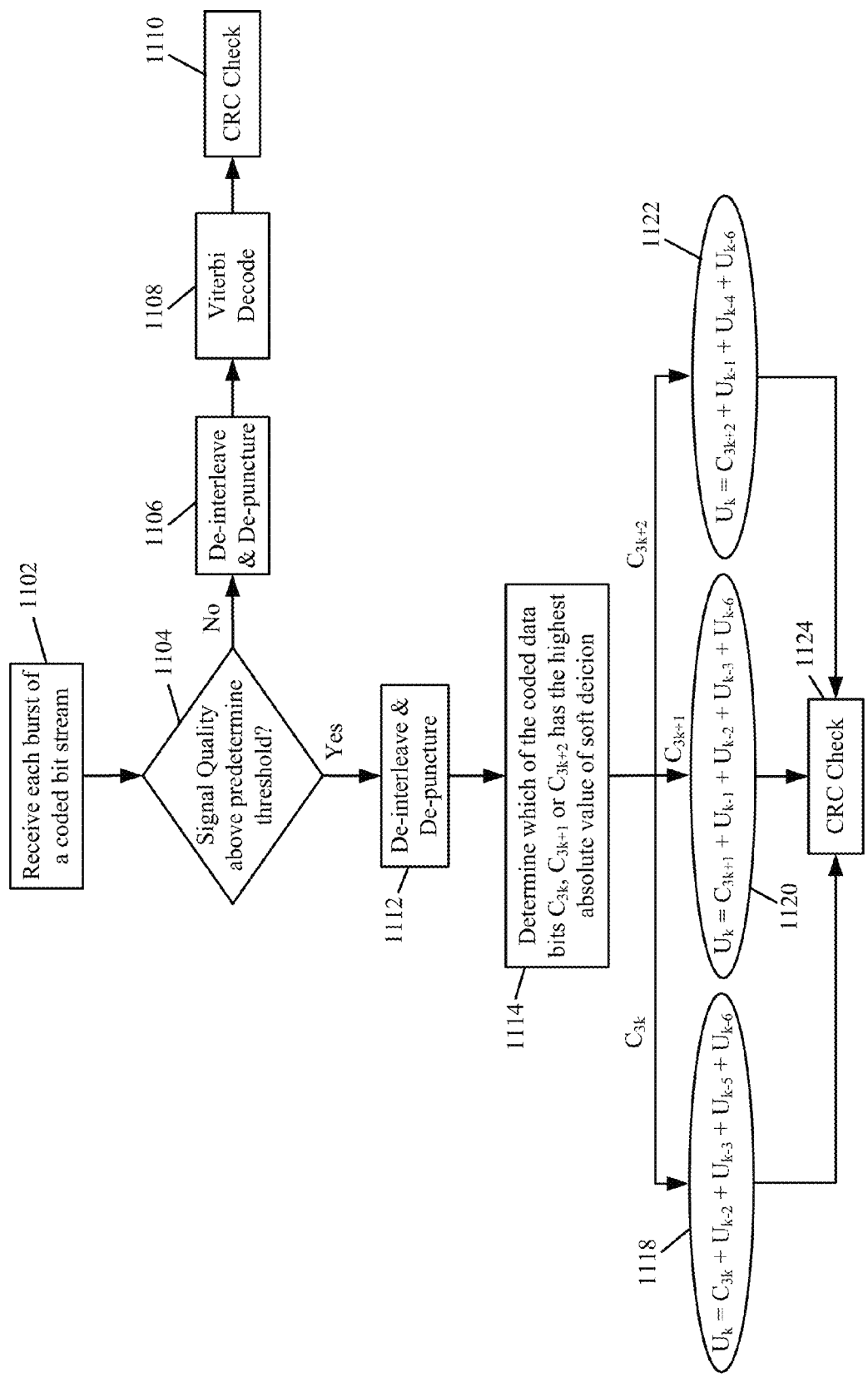
FIG. 11 is a flow diagram illustrating at least one implementation of a process that may be employed by a decoder to decode data that has been 1/3-rate convolutional coded according to the generator polynomials referred to in FIG. 4.

FIG. 11 is a flow diagram illustrating at least one implementation of the method 600 operational on a communications device 200 to decode data that has been 1/3-rate convolutional coded according to the generator polynomials described above with reference to FIG. 4. Referring to FIGS. 2, 5, and 11, all bursts of a coded bit stream may be received at operation block 1102. For example, the processing circuit 206 of the communications device 200 may receive a coded bit stream via the communications interface 202. In this example, each of the bursts of the coded bit stream are received. For example, where each data block includes four bursts, all four bursts are received at the communications device 200.

At decision diamond 1104, it can be determined whether received burst(s) have signal quality above a predetermined threshold. For instance, the decoding component selector 506 of the decoder 218 can obtain the soft decisions values from the soft decision module 510 and/or signal-to-noise ratio values from the SNR module 508 to determine whether the received burst(s) have values that are above a predetermined threshold, as well as a bit error rate below a predetermined threshold.

If the signal quality is not above a threshold, then conventional decoding is employed. For example, the decoding component selector 506 can employ the second decoding component 504 to decode the coded bit stream with, for instance, a Viterbi decoder. In this case, the coded bit stream is de-interleaved at operation block 1106 by the de-interleaver 220. In some instances, the coded bit stream may also be punctured, meaning that a portion of the original data was purposefully left out of the transmission. In such cases, the coded bit stream is also de-punctured at operation block 1106 generally by the processing circuit 206. The coded bit stream can then be decoded by the second decoding component 504 (e.g., using Viterbi decoding at operation block 1108), and a CRC check can be performed on the decoded data at operation block 1110.

If, on the other hand, the signal quality associated with the received coded bit stream is sufficiently high at decision diamond 1104, then the decoding component selector 506 may select the first decoding component 502 to decode the coded bit stream. Initially, the coded data is de-interleaved at block 1112 by the de-interleaver 220. As already noted, the coded data may also be de-punctured at operation block 1112 by the processing circuit 206.

The de-interleaved and de-punctured data can be received at the first decoding component 502, where coded data bits $C_{3k}$, $C_{3k+1}$, and $C_{3k+2}$ can be obtained from the convolutional coded bit stream. At operation block 1114, the first decoding component 502 can determine which of the coded data bits $C_{3k}$, $C_{3k+1}$ or $C_{3k+2}$ has the highest absolute value of soft decision. In at least one example, the first decoding component 502 may rearrange the coded bit stream into a matrix so that the absolute value of the soft decision for each of the three coded data bits $C_{3k}$, $C_{3k+1}$, and $C_{3k+2}$ are arranged in individual rows for each information bit $U_k$. For instance, the first decoding component 502 may rearrange the data so the absolute value associated with each symbol is arranged in a particular row of a matrix for each information bit $U_k$.

With the data rearranged into a matrix, the soft decisions for each of the three symbols in each column can be analyzed. That is, the first decoding component 502 can determine which of the coded data bits $C_{3k}$, $C_{3k+1}$, or $C_{3k+2}$ has the highest absolute value of soft decision. For example, the first decoding component 502 may identify which row has the soft decision with the highest absolute value, and can select the coded data bit $C_{3k}$, $C_{3k+1}$, or $C_{3k+2}$ associated with that row. Once the coded data bit $C_{3k}$, $C_{3k+1}$, or $C_{3k+2}$ with the highest soft decision is identified, the first decoding component 502 can determine which algebraic equation to use to calculate the information bit $U_k$.

For example, if the coded bit $C_{3k}$ is determined to have the highest soft decision value, then the equation associated with $C_{3k}$ is used at operation 1118 to calculate the information bit $U_k$. That is, if the row from the matrix associated with the coded data bit $C_{3k}$ is identified as having the highest absolute value for soft decision, the first decoding component 502 can calculate the information bit $U_k$ according to the equation $U_k = C_{3k} + U_{k-2} + U_{k-3} + U_{k-5} + U_{k-6}$ as indicated as operation 1118.

If the coded bit $C_{3k+1}$ is selected as the highest soft decision value, then the equation associated with $C_{3k+1}$ is used at operation 1120 to calculate the information bit $U_k$. That is, if the row associated with the coded data bit $C_{3k+1}$ is identified as having the highest absolute value for soft decision, the first decoding component 502 can calculate the information bit $U_k$ according to the equation $U_k = C_{3k+1} + U_{k-1} + U_{k-2} + U_{k-3} + U_{k-6}$.

Furthermore, if the coded bit $C_{3k+2}$ is selected as the highest soft decision value, then the equation associated with $C_{3k+2}$ is used at operation 1122 to calculate the information bit $U_k$. That is, if the row associated with the coded data bit $C_{3k+2}$ is identified as having the highest absolute value for soft decision, the first decoding component 502 can calculate the information bit $U_k$ according to the equation $U_k = C_{3k+2} + U_{k-1} + U_{k-4} + U_{k-6}$.

A CRC check can be performed to the decoded data at block 1124. For instance, the first decoding component 502 may perform a conventional CRC check to determined whether the data has been decoded accurately. Similar to the example described above with reference to FIG. 10, if the CRC check fails, the data can be subsequently decoded by the second decoding component 504 (e.g., using Viterbi decoding at block 1108).

By employing algebraic decoding (as described herein) to decode a 1/3-rate convolutional coded bit stream when the signal quality is sufficiently high, a communications device 200 can significantly reduce the processing load on the processing circuit 206. For instance, in at least one example using a conventional Viterbi decoder (e.g., in the second decoding component 504), it may take about 68,000 processing cycles to complete decoding of a 1/3-rate convolutional coded EGPRS data block. In contrast, at least one example of a first decoding component 502 implementing the algebraic decoding scheme discussed above may be capable of decoding the same EGPRS data block in about 2000 processing cycles. This significant reduction in processing cycles can result in reduced power consumption, faster processing, lower thermal emission, as well as other or different benefits (relative to situations where reduced processing cycles is not achieved).

While the above discussed aspects, arrangements, and embodiments are discussed with certain features, one or more of the components, steps, features and/or functions illustrated in FIGS. 1, 2, 3, 4, 5, 6, 7, 8, 9, 10 and/or 11 may be rearranged and/or combined into a single component, step, feature or function or embodied in several components, steps, or functions. Additional elements, components, steps, and/or functions may also be added ore not utilized without departing from the scope of the present disclosure. The apparatus, devices and/or components illustrated in FIGS. 1, 2 and/or 5 may be configured to perform one or more of the methods, features, or steps described in FIGS. 3, 4, 6, 7, 8, 9, 10 and/or 11. The novel algorithms described herein may also be efficiently implemented in software and/or embedded in hardware. Also, it is noted that at least some implementations have been described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a function, a procedure, a subroutine, a subprogram, etc. When a process corresponds to a function, its termination corresponds to a return of the function to the calling function or the main function.

Those of skill in the art would further appreciate that the various illustrative logical blocks, modules, circuits, and algorithm steps described in connection with the embodiments disclosed herein may be implemented as hardware, software, firmware, middleware, microcode, or any combination thereof. To clearly illustrate this interchangeability, various illustrative components, blocks, modules, circuits, and steps have been described above generally in terms of their functionality. Whether such functionality is implemented as hardware or software depends upon the particular application and design constraints imposed on the overall system.

The terms "machine-readable medium", "computer-readable medium", and/or "processor-readable medium" may include, but are not limited to portable or fixed storage devices, optical storage devices, and various other non-transitory mediums capable of storing, containing or carrying instruction(s) and/or data. Thus, the various methods described herein may be partially or fully implemented by instructions and/or data that may be stored in a "machine-readable medium", "computer-readable medium", and/or "processor-readable medium" and executed by one or more processors, machines and/or devices.

The various features of the embodiments described herein can be implemented in different systems without departing from the scope of the disclosure. It should be noted that the foregoing embodiments are merely examples and are not to be construed as limiting the disclosure. The description of the embodiments is intended to be illustrative, and not to limit the scope of the claims. As such, the present teachings can be readily applied to other types of apparatuses and many alternatives, modifications, and variations will be apparent to those skilled in the art.

What is claimed is:

1. A communications device comprising a decoder, wherein the decoder comprises:
   a first decoding circuit configured to:
      obtain a plurality of coded data bits 'C' from a convolutional coded bit stream that is half-rate convolutional coded according to generator polynomials $G_0 = 1 + D^3 + D^4$ and $G_1 = 1 + D + D^3 + D^4$, where 'D' represents a bit location and where only three of four bursts of a data block of the convolutional coded bit stream are available;
      determine a decoded value for each information bit $U_{2k-1}$ at least by calculating a modulo 2 sum of a coded data bit $C_{4k}$ added to another coded data bit $C_{4k+1}$ from the coded bit stream, where 'k' represents an index value between 0 and a number 'n' based on a number of bits in a burst of the bit stream; and
      determine a decoded value for each information bit $U_{2k}$ at least by calculating a modulo 2 sum of a coded data bit $C_{2(2k+3)}$ added to a previously calculated information bit $U_{2k+3}$ and to a previously calculated information bit $U_{2k-1}$.

2. The communications device of claim 1, wherein the decoder further comprises a second decoding circuit configured to decode the convolutional coded bit stream with Viterbi decoding.

3. A method operational on a communications device, comprising:
  receiving by a processing circuitry, a half-rate convolutional coded bit stream coded according to generator polynomials $G_0=1+D^3+D^4$ and $G_1=1+D+D^3+D^4$ where 'D' represents a bit location and including a plurality of coded data bits 'C', where three out of four bursts of a data block of the half-rate convolutional coded bit stream are available;
  determining whether a signal quality associated with the convolutional coded bit stream is above a predetermined threshold; and
  when the signal quality associated with the convolutional coded bit stream is above the predetermined threshold, determining a decoded value for each information bit $U_{2k-1}$ at least by calculating a modulo 2 sum of a coded data bit $C_{4k}$ added to another coded data bit $C_{4k+1}$ from the coded bit stream, and determining another decoded value for each information bit $U_{2k}$ at least by calculating a modulo 2 sum of a coded data bit $C_{2(2k+3)}$ added to a previously calculated information bit $U_{2k+3}$ and to a previously calculated information bit $U_{2k-1}$, where 'k' represents an index value between 0 and a number 'n' based on a number of bits in a burst of the bit stream.

4. The method of claim 3, wherein determining whether the signal quality associated with the convolutional coded bit stream is above the predetermined threshold comprises:
  determining the signal quality from one or more factors from a plurality of factors comprising:
    whether absolute values for soft decisions associated with the coded bit stream are above a predetermined threshold;
    whether a signal-to-noise ratio associated with the coded bit stream is above a predetermined threshold; and
    whether a bit error rate is below a predetermined threshold.

5. The method of claim 3, further comprising: performing a cyclic redundancy (CRC) check to determine whether the data has been decoded accurately; and if the CRC check fails, decoding the convolutional coded bit stream with Viterbi decoding.

6. The method of claim 3, further comprising: decoding the convolutional coded bit stream with Viterbi decoding if the signal quality associated with the convolutional coded bit stream is below the predetermined threshold.

7. A communications device comprising a decoder, wherein the decoder comprises:
  a first decoding circuit configured to:
    obtain a plurality of coded data bits 'C' from a convolutional coded bit stream that is half-rate convolutional coded according to generator polynomials $G_0=1+D^3+D^4$ and $G_1=1+D+D^3+D^4$, where 'D' represents a bit location, and where only two of four bursts of a data block of the convolutional coded bit stream are available;
    determine a decoded value for each information bit $U_{2k-1}$ at least by calculating a modulo 2 sum of a coded data bit $C_{4k}$ added to another coded data bit $C_{4k+1}$ from the coded bit stream, where 'k' represents an index value between 0 and a number 'n' based on a number of bits in a burst of the bit stream; and
    determine another decoded value for each information bit $U_{2k}$ at least by calculating a modulo 2 sum of a coded data bit $C_{4k}$ added to a previously calculated information bit $U_{2k-3}$ and to a previously calculated information bit $U_{2k-4}$.

8. The communications device of claim 7, wherein the decoder further comprises a second decoding circuit configured to decode the convolutional coded bit stream with Viterbi decoding.

9. A method operational on a communications device, comprising:
  receiving, by a processing circuitry, a half-rate convolutional coded bit stream coded according to generator polynomials $G_0=1+D^3+D^4$ and $G_1=1+D+D^3+D^4$ and including a plurality of coded data bits 'C', where 'D' represents a bit location, and where two out of four bursts of a data block of the half-rate convolutional coded bit stream are available;
  determining whether a signal quality associated with the convolutional coded bit stream is above a predetermined threshold; and
  when the signal quality associated with the convolutional coded bit stream is above the predetermined threshold, determining a decoded value for each information bit $U_{2k-1}$ at least by calculating a modulo 2 sum of a coded data bit $C_{4k}$ added to another coded data bit $C_{4k+1}$ from the coded bit stream, and determining another decoded value for each information bit $U_{2k}$ at least by calculating a modulo 2 sum of a coded data bit $C_{4k}$ added to a previously calculated information bit $U_{2k-3}$ and to a previously calculated information bit $U_{2k-4}$, where 'k' represents an index value between 0 and a number 'n' based on a number of bits in a burst of the bit stream.

10. The method of claim 9, wherein determining whether the signal quality associated with the convolutional coded bit stream is above the predetermined threshold comprises:
  determining the signal quality from one or more factors from a plurality of factors comprising:
    whether absolute values for soft decisions associated with the coded bit stream are above a predetermined threshold;
    whether a signal-to-noise ratio associated with the coded bit stream is above a predetermined threshold; and
    whether a bit error rate is below a predetermined threshold.

11. The method of claim 9, further comprising: performing a cyclic redundancy (CRC) check to determine whether the data has been decoded accurately; and if the CRC check fails, decoding the convolutional coded bit stream with Viterbi decoding.

12. The method of claim 9, further comprising: decoding the convolutional coded bit stream with Viterbi decoding if the signal quality associated with the convolutional coded bit stream is below the predetermined threshold.

13. A communications device comprising a decoder, wherein the decoder comprises:
  a first decoding circuit configured to:
    obtain coded data bits $C_{3k}$, $C_{3k+1}$ and $C_{3k+2}$ from a convolutional coded bit stream that is 1/3-rate convolutional coded according to generator polynomials $G_4=1+D^2+D^3+D^5+D^6$, $G_7=1+D+D^2+D^3+D^6$, and $G_5=1+D+D^4+D^6$, where 'D' represents a bit location;
    determine which of the coded data bits $C_{3k}$, $C_{3k+1}$ or $C_{3k+2}$ has the highest absolute value of soft decision, where 'k' represents an index value between 0 and a number 'n' based on a number of bits in a burst of the bit stream; and
    determine a decoded value for each information bit $U_k$ at least by calculating a modulo 2 sum of one of the coded data bits $C_{3k}$, $C_{3k+1}$ or $C_{3k+2}$ added to a plurality of previously calculated information bits 'U'.

14. The communications device of claim 13, wherein if the coded data bit $C_{3k}$ has the highest absolute value of soft decision, the first decoding circuit is configured to:
   determine the decoded value for each information bit $U_k$ at least by calculating a modulo 2 sum of the coded data bit $C_{3k}$ added to a previously calculated information bit $U_{k-2}$, to a previously calculated information bit $U_{k-3}$, to a previously calculated information bit $U_{k-5}$, and to a previously calculated information bit $U_{k-6}$.

15. The communications device of claim 13, wherein if the coded data bit $C_{3k+1}$ has the highest absolute value of soft decision, the first decoding circuit is configured to:
   determine the decoded value for each information bit $U_k$ at least by calculating a modulo 2 sum of the coded data bit $C_{3k+1}$ added to a previously calculated information bit $U_{k-1}$, to a previously calculated information bit $U_{k-2}$, to a previously calculated information bit $U_{k-3}$, and to a previously calculated information bit $U_{k-6}$.

16. The communications device of claim 13, wherein if the coded data bit $C_{3k+2}$ has the highest absolute value of soft decision, the first decoding circuit is configured to:
   determine the decoded value for each information bit $U_k$ at least by calculating a modulo 2 sum of the coded data bit $C_{3k+2}$ added to a previously calculated information bit $U_{k-1}$, to a previously calculated information bit $U_{k-4}$, and to a previously calculated information bit $U_{k-6}$.

17. The communications device of claim 13, wherein the decoder further comprises a second decoding circuit configured to decode the convolutional coded bit stream with Viterbi decoding.

18. A method operational on a communications device, comprising:
   receiving, by a processing circuitry, a 1/3-rate convolutional coded bit stream coded according to generator polynomials $G_4=1+D^2+D^3+D^5+D^6$, $G_7=1+D+D^2+D^3+D^6$, and $G_5=1+D+D^4+D^6$, where 'D' represents a bit location, and including a plurality of coded data bits $C_{3k}$, $C_{3k+1}$ and $C_{3k+2}$, where 'k' represents an index value between 0 and a number 'n' based on a number of bits in a burst of the bit stream;
   determining whether a signal quality associated with the convolutional coded bit stream is above a predetermined threshold; and
   when the signal quality associated with the convolutional coded bit stream is above the predetermined threshold, determining a decoded value for each information bit $U_k$ at least by calculating a modulo 2 sum of one of the coded data bits $C_{3k}$, $C_{3k+1}$ or $C_{3k+2}$ added to a plurality of previously calculated information bits 'U'.

19. The method of claim 18, wherein determining the decoded value for each information bit $U_k$ at least by calculating a modulo 2 sum of one of the coded data bits $C_{3k}$, $C_{3k+1}$ or $C_{3k+2}$ added to a plurality of previously calculated information bits 'U' comprises:
   determining which of the coded data bits $C_{3k}$, $C_{3k+1}$ or $C_{3k+2}$ has the highest absolute value of soft decision;
   when the coded data bit $C_{3k}$ has the highest absolute value of soft decision, determining a decoded value for each information bit $U_k$ at least by calculating a modulo 2 sum of the coded data bit $C_{3k}$ added to a previously calculated information bit $U_{k-2}$, to a previously calculated information bit $U_{k-3}$, to a previously calculated information bit $U_{k-5}$, and to a previously calculated information bit $U_{k-6}$;
   when the coded data bit $C_{3k+1}$ has the highest absolute value of soft decision, determining the decoded value for each information bit $U_k$ at least by calculating a modulo 2 sum of the coded data bit $C_{3k+1}$ added to a previously calculated information bit $U_{k-1}$, to a previously calculated information bit $U_{k-2}$, to a previously calculated information bit $U_{k-3}$, and to a previously calculated information bit $U_{k-6}$; and
   when the coded data bit $C_{3k+2}$ has the highest absolute value of soft decision, determining the decoded value for each information bit $U_k$ at least by calculating a modulo 2 sum of the coded data bit $C_{3k+2}$ added to a previously calculated information bit $U_{k-1}$, to a previously calculated information bit $U_{k-4}$, and to a previously calculated information bit $U_{k-6}$.

20. The method of claim 18, wherein determining whether the signal quality associated with the convolutional coded bit stream is above the predetermined threshold comprises:
   determining the signal quality from one or more factors from a plurality of factors comprising:
      whether absolute values for soft decisions associated with the coded bit stream are above a predetermined threshold;
      whether a signal-to-noise ratio associated with the coded bit stream is above a predetermined threshold; and
      whether a bit error rate is below a predetermined threshold.

21. The method of claim 18, further comprising:
   performing a cyclic redundancy (CRC) check to determine whether the data has been decoded accurately; and if the CRC check fails, decoding the convolutional coded bit stream with Viterbi decoding.

22. The method of claim 18, further comprising:
   decoding the convolutional coded bit stream with Viterbi decoding if the signal quality associated with the convolutional coded bit stream is below the predetermined threshold.

* * * * *